(12) United States Patent
Pinarbasi et al.

(10) Patent No.: US 8,772,076 B2
(45) Date of Patent: Jul. 8, 2014

(54) BACK CONTACT DIFFUSION BARRIER LAYERS FOR GROUP IBIIIAVIA PHOTOVOLTAIC CELLS

(75) Inventors: Mustafa Pinarbasi, Morgan Hill, CA (US); James Freitag, Sunnyvale, CA (US); Jorge Vasquez, San Jose, CA (US)

(73) Assignee: Solopower Systems, Inc., San Jose, CA (US)

( * ) Notice: Subject to any disclaimer, the term of this patent is extended or adjusted under 35 U.S.C. 154(b) by 397 days.

(21) Appl. No.: 12/875,669

(22) Filed: Sep. 3, 2010

(65) Prior Publication Data
US 2012/0055543 A1    Mar. 8, 2012

(51) Int. Cl.
*H01L 31/18* (2006.01)
(52) U.S. Cl.
USPC ............. 438/95; 438/104; 257/E31.007

(58) Field of Classification Search
CPC ............... H01L 31/022483; H01L 31/1864
USPC ............................................ 257/E31.007
See application file for complete search history.

(56) References Cited

U.S. PATENT DOCUMENTS

| | | | | |
|---|---|---|---|---|
| 5,676,766 A | * | 10/1997 | Probst et al. | 136/265 |
| 2006/0096537 A1 | * | 5/2006 | Tuttle | 118/720 |
| 2007/0209700 A1 | * | 9/2007 | Yonezawa et al. | 136/265 |
| 2008/0280030 A1 | * | 11/2008 | Van Duren et al. | 427/74 |
| 2010/0212732 A1 | * | 8/2010 | Schmidt et al. | 136/256 |

* cited by examiner

*Primary Examiner* — Stephen W Smoot

(57) ABSTRACT

The present invention provides for new ohmic contact materials and diffusion barriers for Group IBIIIAVIA based solar cell structures, which eliminate two way diffusion while preserving the efficient ohmic contacts between the substrate and the absorber layers.

14 Claims, 2 Drawing Sheets

BACK CONTACT DIFFUSION BARRIER LAYERS FOR GROUP IBIIIAVIA PHOTOVOLTAIC CELLS

BACKGROUND

1. Field of the Inventions

The present inventions generally relate to apparatus and methods of solar cell design and fabrication and, more particularly, to forming contact layers and diffusion barriers for such solar cells.

2. Description of the Related Art

Solar cells are photovoltaic devices that convert sunlight directly into electrical energy. Solar cells can be based on crystalline silicon or thin films of various semiconductor materials, usually deposited on low-cost substrates, such as glass, plastic, or stainless steel.

Thin film based photovoltaic cells, such as amorphous silicon, cadmium telluride, copper indium diselenide or copper indium gallium diselenide based solar cells, offer improved cost by employing deposition techniques widely used in the thin film industry. Group IBIIIAVIA compound photovoltaic cells including copper indium gallium diselenide (CIGS) based solar cells have demonstrated the greatest potential for high performance, high efficiency, and low cost thin film PV products.

A conventional Group IBIIIAVIA compound solar cell can be built on a substrate that can be a sheet of glass, a sheet of metal, an insulating foil or web, or a conductive foil or web. A contact layer such as a molybdenum (Mo) film is deposited on the substrate as the back electrode of the solar cell. An absorber thin film including a material in the family of $Cu(In,Ga)(S,Se)_2$, is formed on the conductive Mo film. Although there are other methods, $Cu(In,Ga)(S,Se)_2$ type compound thin films are typically formed by a two-stage process where the components (components being Cu, In, Ga, Se and S) of the $Cu(In,Ga)(S,Se)_2$ material are first deposited onto the substrate or the contact layer formed on the substrate as an absorber precursor, and then reacted with S and/or Se in a high temperature annealing process.

After the absorber film is formed, a transparent layer, for example, a CdS film, a ZnO film or a CdS/ZnO film-stack is formed on the absorber film. The preferred electrical type of the absorber film is p-type, and the preferred electrical type of the transparent layer is n-type. However, an n-type absorber and a p-type window layer can also be formed. The above described conventional device structure is called substrate-type structure. In the substrate structure light enters the device from the transparent layer side. A so called superstrate-type structure can also be formed by depositing a transparent conductive layer on a transparent superstrate such as glass or transparent polymeric foil, and then depositing the $Cu(In,Ga)(S,Se)_2$ absorber film, and finally forming an ohmic contact to the device by a conductive layer. In the superstrate structure light enters the device from the transparent superstrate side.

In standard CIGS as well as Si and amorphous Si module technologies, the solar cells can be manufactured on flexible conductive substrates such as stainless steel foil substrates. Due to its flexibility, a stainless steel substrate allows low cost roll-to-roll solar cell manufacturing techniques. In such solar cells built on conductive substrates, the transparent layer and the conductive substrate form the opposite poles of the solar cells. Multiple solar cells can be electrically interconnected by stringing or shingling methods that establish electrical connection between the opposite poles of the solar cells. Such interconnected solar cells are then packaged in protective packages to form solar modules or panels. Many modules can also be combined to form large solar panels. The solar modules are constructed using various packaging materials to mechanically support and protect the solar cells in them against mechanical damage. Each module typically includes multiple solar cells which are electrically connected to one another using above mentioned stringing or shingling interconnection methods.

The conversion efficiency of a thin film solar cell depends on many fundamental factors, such as the bandgap value and electronic and optical quality of the absorber layer, the quality of the window layer, the quality of the rectifying junction, and so on. Since the total thickness of the electrically active layers of the CIGS thin film solar cells is in the range of 0.5-5 micrometers, these devices are highly sensitive to defects. Even the sub-micron size defects may influence their illuminated I-V characteristics. A prior art problem associated with manufacturing CIGS thin film devices on stainless steel substrates, however, is the inadvertent introduction of defects into the device structure during the reaction of the absorber precursor. During this step, the constituents of the stainless steel substrate diffuse towards the absorber layer, and Se from the absorber precursor diffuses towards the stainless steel substrate. Despite the advantages of flexible stainless steel substrates in CIGS solar cell applications, during the high temperature anneal, Se from the absorber precursor can diffuse through the Mo contact layer toward the substrate, corrode the stainless steel and form FeSe compounds on the substrate, which cause electrical shunting defects. Such shunting defects introduce a shunting path, between the substrate and the absorber or the transparent layer through which the electrical current of the device may leak. The shunting defects lower the fill factor, the voltage and the conversion efficiency of the solar cells. Furthermore, the atoms of the stainless steel such as iron (Fe) atoms can diffuse from the substrate into the CIGS absorber by diffusing through the Mo contact layer during the aforementioned high temperature anneal or reaction process that forms the absorber. This unwanted material diffusion into the absorber significantly degrades the performance of the absorber and the resulting device. One prior art process uses a chromium (Cr) layer to prevent Fe diffusion into the absorber; however, Cr forms CrSe with Se from the absorber precursor during the reaction step, and just like FeSe, Cr causes shunting defects.

SUMMARY

The present inventions provide for new ohmic contact materials and diffusion barriers for Group IBIIIAVIA based solar cell structures, which eliminate two way diffusion while preserving the efficient ohmic contacts between the substrate and the absorber layers.

In one aspect is described a method of manufacturing a $Cu(In,Ga)$ $Se_2$ thin-film solar cell, comprising: forming an intermediate layer on a surface of a flexible conductive substrate, the flexible conductive substrate including iron (Fe) species, the step of forming the intermediate layer comprising: forming a conductive barrier stack on the surface of the flexible conductive substrate, the conductive barrier stack including a chromium (Cr) film applied to the surface of the flexible conductive substrate and a titanium nitride (TiN) film deposited on the Cr film; depositing a contact layer on the conductive barrier stack; depositing a nucleation layer on the contact layer; depositing an absorber precursor including Cu species, In species, Ga species and Se species over the nucleation layer; applying heat to the absorber precursor to form therefrom an absorber layer including a $Cu(In,Ga)$ $Se_2$ thin film compound, wherein the step of forming the absorber layer causes some of the Fe species in the flexible substrate to diffuse towards the absorber layer and some of the Se species in the absorber layer to diffuse towards the flexible conductive substrate, and wherein the conductive barrier stack inhibits diffusion of both the iron (Fe) species and the Se species across the conductive barrier stack during the step of applying heat; disposing a transparent conductive layer on the thin film absorber layer, the transparent layer including a buffer layer deposited on the thin film absorber and a transparent conductive oxide layer formed on the buffer layer; forming a top terminal on the transparent conductive layer, thereby resulting in the Cu(In,Ga)Se$_2$ thin-film solar cell; and wherein after the step of forming, the conductive barrier stack continues to inhibit diffusion of both the iron (Fe) species and the Se species across the conductive barrier stack.

In another aspect is described a solar cell, comprising: a flexible conductive substrate including Fe species; a thin film absorber layer including Cu species, In species, Ga species and Se species formed over the flexible conductive substrate layer; an intermediate layer disposed between the flexible conductive substrate and the thin film absorber layer, the intermediate layer including: a conductive barrier stack on the surface of the flexible conductive substrate, the conductive barrier stack including a chromium (Cr) film applied to the surface of the flexible conductive substrate and a titanium nitride (TiN) film deposited on the Cr film, wherein the conductive barrier stack inhibits diffusion of both the iron (Fe) species from the flexible conductive substrate across the conductive barrier stack and the selenium Se species from the thin film absorber layer across the conductive barrier stack; a contact layer deposited on the conductive barrier stack; a nucleation layer deposited on the contact layer; a transparent layer deposited on the thin film absorber layer, the transparent layer including a buffer layer deposited on the thin film absorber and a transparent conductive oxide layer formed on the buffer layer; and a top terminal formed on the transparent layer.

These and other aspects and advantages are described further herein.

DETAILED DESCRIPTION OF THE PREFERRED EMBODIMENTS

The preferred embodiments described herein provide solar cell manufacturing methods and device structures to prevent unwanted material diffusion between a metallic substrate and a Group IBIIIAVIA thin film absorber of a solar cell during the manufacture of the solar cell. In one embodiment, an intermediate layer, including multiple conductive material films, is disposed between a stainless steel substrate and an absorber layer of a solar cell. The absorber layer may be a Cu(In,Ga)(Se,S)$_2$ or CIGSS compound thin film which is formed by annealing (reacting) an absorber precursor including Cu, In, Ga and Se, and optionally S at temperature range of about 400-600° C. in a reactor. Accordingly, during the reaction, the intermediate layer of the present invention inhibits or minimizes both unwanted diffusion mechanisms, namely, the iron (Fe) diffusion from the stainless-steel substrate to the absorber layer and the selenium (Se) diffusion from the absorber layer to the stainless steel. In one embodiment, a first intermediate layer includes: a diffusion barrier stack deposited on the stainless steel substrate; a contact layer, such as a Mo layer, deposited on the diffusion barrier stack; a nucleation layer, such as a Ru layer, deposited on the contact layer; and a seed layer, such as a Cu layer, deposited on the nucleation layer. The diffusion barrier stack preferably includes a metal barrier layer, such as a Cr layer, deposited on the stainless steel substrate and a metal nitride barrier layer, such as a TiN layer, deposited metal barrier layer. In another embodiment, a second intermediate layer preferably includes: a diffusion barrier stack including a Cr layer deposited on the stainless steel substrate and a first TiN layer deposited on the Cr layer; a first contact layer, such as a first Mo layer, deposited on the diffusion barrier stack; a second TiN layer deposited on the first contact layer; a second contact layer, such as a second Mo layer, deposited on the second TiN layer; a nucleation layer, such as a Ru layer, deposited on the second contact layer; and a seed layer, such as a Cu layer, deposited on the nucleation layer.

Figure 1A:
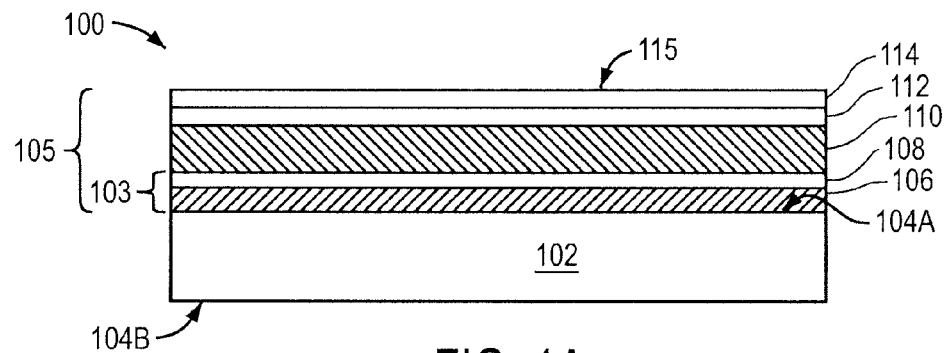
FIG. 1A is a schematic side view of an embodiment of a solar cell base of the present invention.

FIG. 1A shows a base 100 including a flexible substrate 102 having a front surface 104A and a back surface 104B, and an intermediate layer 105 disposed on the front surface of the flexible substrate 102. The intermediate layer 105 preferably includes multiple conductive films. In one embodiment, the intermediate layer 105 includes: a diffusion barrier stack 103, a contact layer 110, a nucleation layer 112, and a seed layer 114. In one example, the diffusion barrier stack 103 preferably includes, but is not limited to, a metal barrier layer 106 deposited on the stainless steel substrate and a metal-nitride barrier layer 108 deposited on the metal barrier layer 106. The metal barrier layer 106 may be a Cr layer or may be Cr alloy such as CrMo, or multiple layers of Cr and Cr alloys. The thickness of the metal barrier layer 106 may be in the range of 50-100 nm, preferably 80-100 nm, and more preferably 95-100 nm. The metal nitride barrier layer 108 may include titanium-nitride (TiN), tantalum nitride (TaN), or tungsten nitride (WN), and may be fully or partially made of TiN or a combination of the above nitrides. The thickness of the metal-nitride barrier layer 108 may be in the range of 200-400 nm, preferably 250-350 nm, and more preferably 290-300 nm. The metal barrier layer 106 and metal-nitride barrier layer 108 may be deposited using PVD processes such as reactive sputtering processes in a nitrogen-containing atmosphere.

The contact layer 110 may be a Mo layer and deposited onto the metal-nitride barrier 108 of the barrier stack 105. Alternatively, materials such as W, Ta and Ti may also be used as contact layer. The thickness of the contact layer may be in the range of 400-1000 nm, preferably 500-900 nm.

The nucleation layer 112 may be deposited on the contact layer 110 and may include ruthenium (Ru) or a Ru alloy. The nucleation layer forms an additional diffusion barrier on the contact layer 110 and when formed on the contact layer or in replacement of the contact layer, the nucleation layer 112 increases the chemical inertness and strength of the contact layer 110, especially when wet techniques such as electrodeposition and electroless deposition are used to form precursor stacks. The nucleation layer 112 also provides better nucleation capability and adhesion to the materials deposited on it. Ru layer may be deposited by techniques such as electroless deposition, electroplating, atomic layer deposition, CVD, MOCVD, and PVD among others. The thickness of the nucleation layer 112 may be in range of 1-300 nm, preferably 5-100 nm. Thin nucleation layers are preferred for cost reduction purposes. The seed layer 114 is a thin copper layer and preferably deposited on the nucleation layer 112. When depositing an absorber precursor layer through a wet process such as electroplating or electroless plating, a seed layer may be used in place of or on top of the nucleation layer. For example, if a stack including Cu, In, and Ga films is electroplated or electroless plated on the seed layer, the seed layer acts as an adhesion/nucleation layer on which the electroplated metal bonds well. For example, a sputtered, CVD deposited, or ALD deposited Cu film of 2-100 nm thickness acts as an efficient seed layer upon which the precursors comprising at least one of Cu, In and Ga may be deposited with good adhesion and morphology. The seed layer also improves adhesion and uniformity of $Cu(In,Ga)(Se)_2$ layer or $Cu(In,Ga)(S, Se)_2$ formed by techniques other that electrodeposition.

Figure 1B:
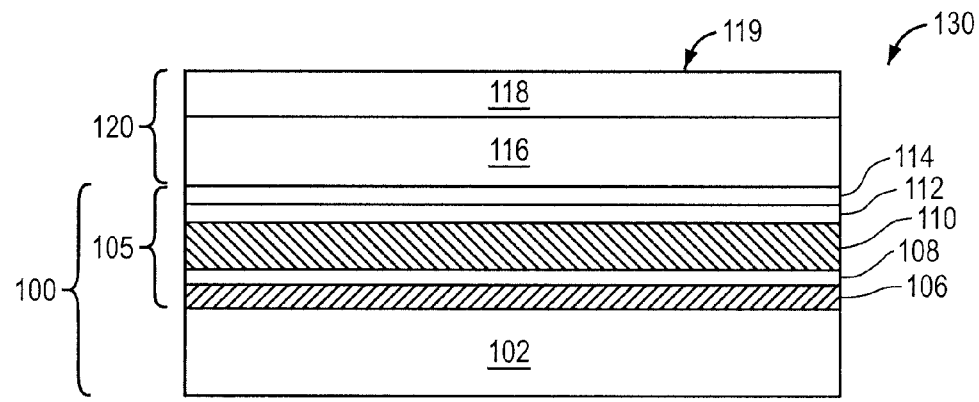
FIG. 1B is a schematic side view of solar cell using the solar cell base shown in FIG. 1A.
Figure 1C:
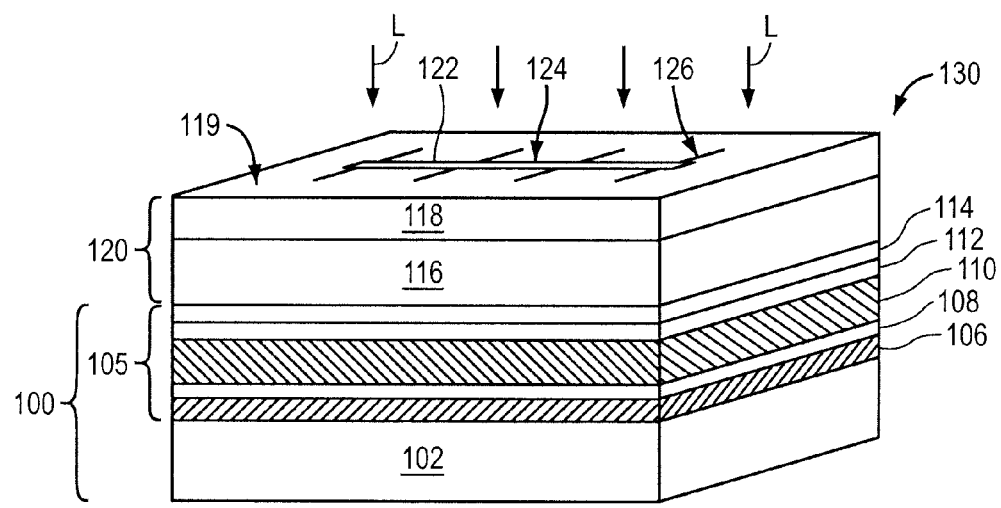
FIG. 1C is schematic perspective view of the solar cell shown in FIG. 1B.

As shown in FIG. 1B in side view and in 1C in perspective view, once the base layer 100 is completed, a front side 120 including an absorber layer, a transparent layer and a conductive grid is formed on the base to complete a solar cell 130. The absorber layer 116 including a Group IBIIIAVIA compound, such as $Cu(In,Ga)(Se)_2$ or $Cu(In,Ga)(S, Se)_2$, formed on the surface 115 of the seed layer 114. The absorber layer is preferably formed using a two step process including first depositing a precursor layer having Cu, In, Ga and Se, and optionally S, on a surface 115 of the seed layer 114 (or the base 100), and second reacting the precursor layer in a reactor at a temperature range of 300-600° C. in an inert or Se gas and optionally S gas containing atmosphere. Cu, In, Ga and Se may be electroplated to form a precursor stack including one or more films of Cu, In, Ga and Se. Optionally, a stack including Cu, In and Ga films may be first formed by electroplating on the base and then one or more Se films may be vapor deposited on the previously formed stack that includes Cu, In and Ga films. In the next step, the transparent layer 118, which may include a buffer-layer/TCO (transparent conductive oxide) stack, is formed on the absorber layer 116. An exemplary buffer material may be a (Cd, Zn)S which is generally electroless deposited on the absorber layer. The TCO layer is deposited on the buffer layer and an exemplary TCO material may be a ZnO layer, an indium tin oxide (ITO) layer or a stack comprising both ZnO and ITO. The conductive grid 122, including a bulbar 124 and conductive fingers 126, is disposed on a top surface 120 of the transparent layer 118 to collect the current generated when the light depicted by arrows 'L' illuminates a top surface 119 of the transparent layer 118.

As mentioned above, during the reaction step or other deposition steps to form above mentioned layers, unwanted diffusion of impurities into various parts of the solar cell may occur. Se diffusion into stainless steel substrate from the absorber and Fe diffusion into the absorber layer from the stainless steel substrate are two of the harmful diffusion mechanisms that the present invention attempts to eliminate. During the reaction of the absorber precursor, any unwanted Se diffusion towards the stainless steel substrate is inhibited, more preferably substantially inhibited such that FeSe defects are minimized, and most preferably eliminated such that such that FeSe defects do not exist due to the diffusion barrier stack disposed between the absorber layer and the substrate. Without the barrier stack, Se forms FeSe with Fe, which cause shunting defects. Further, Fe diffusion towards the absorber layer is again inhibited, more preferably substantially inhibited such that FeSe defects are minimized, and most preferably eliminated such that such that FeSe defects do not exist due to the same diffusion barrier stack disposed between the absorber layer and the substrate.

Figure 2:
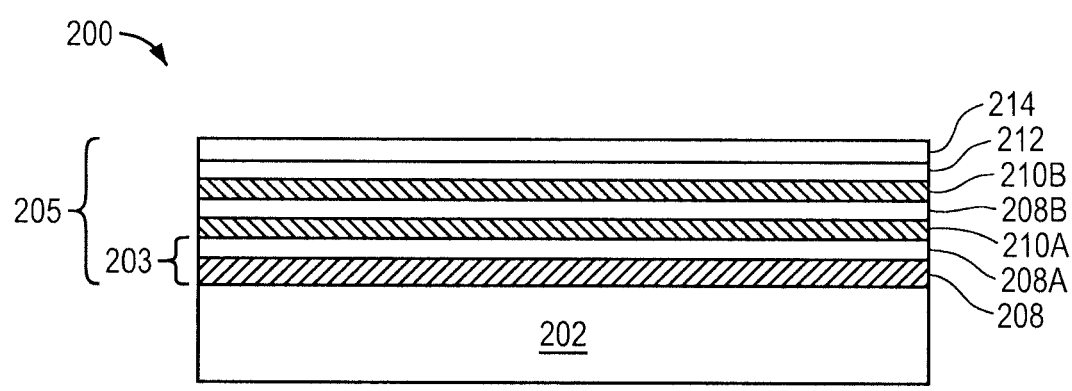
FIG. 2 is a schematic side view of another embodiment of a solar cell base of the present invention.

FIG. 2 shows an alternative base layer 200 including an intermediate layer 205 formed on a flexible substrate 202. The flexible substrate 202 includes stainless steel. The intermediate layer 205 preferably includes multiple conductive films. In one embodiment, the intermediate layer 205 includes: a diffusion barrier stack 203 having a metal barrier layer 206 and a first metal-nitride barrier layer 208A, a first contact layer 210A, a second metal-nitride barrier 208B, a second contact layer 210B, a nucleation layer 212, and a seed layer 214. The first metal barrier layer may be a Cr layer, a Cr alloy layer or their multiple layers. The first and second nitride barrier layers may be TiN layers. The first and second contact layers may preferably be Mo layers. The nucleation layer is a Ru layer or a Ru alloy, and the seed layer is a Cu layer.

In one example, the metal barrier layer 206 deposited on the stainless steel substrate and the first metal-nitride barrier layer 208A deposited on the metal barrier layer 206. The first contact layer 210A is deposited onto the first metal-nitride barrier 208A. The second metal-nitride barrier layer 208B is deposited onto the first contact layer 210A. The second contact layer 210B is deposited onto the second metal nitride barrier layer 208B. The nucleation layer 212 may be deposited on the second contact layer 210B. The seed layer 214 is preferably deposited on the nucleation layer 112. The additional metal/nitride interfaces improve the barrier properties and further reduce diffusion across the barrier layer. The thicknesses of the second bilayer can be in the same range as the first. Various layers depicted in the drawings are not necessarily drawn to scale.

Although aspects and advantages of the present inventions are described herein with respect to certain preferred embodiments, modifications of the preferred embodiments will be apparent to those skilled in the art.

We claim:

1. A method of manufacturing a $Cu(In,Ga) Se_2$ thin-film solar cell, comprising:
   forming an intermediate layer on a surface of a flexible conductive substrate, the flexible conductive substrate including iron (Fe) species, the step of forming the intermediate layer comprising:
      forming a conductive barrier stack on the surface of the flexible conductive substrate, the conductive barrier stack including a chromium (Cr) film applied to the surface of the flexible conductive substrate and a titanium nitride (TiN) film deposited on the Cr film;
      depositing a contact layer on the conductive barrier stack;
      depositing a nucleation layer on the contact layer;
   depositing an absorber precursor including Cu species, In species, Ga species and Se species over the nucleation layer;
   applying heat to the absorber precursor to form therefrom an absorber layer including a $Cu(In,Ga) Se_2$ compound, wherein the step of forming the absorber layer causes some of the Fe species in the flexible substrate to diffuse towards the absorber layer and some of the Se species in the absorber layer to diffuse towards the flexible conductive substrate, and wherein the conductive barrier stack inhibits diffusion of both the iron (Fe) species and the Se species across the conductive barrier stack during the step of applying heat;
   disposing a transparent conductive layer on the absorber layer, the transparent conductive layer including a buffer layer deposited on the absorber layer and a transparent conductive oxide layer formed on the buffer layer;

forming a top terminal on the transparent conductive layer, thereby resulting in the Cu(In,Ga) Se$_2$ thin-film solar cell; and wherein after the step of forming, the conductive barrier stack continues to inhibit diffusion of both the iron (Fe) species and the Se species across the conductive barrier stack.

2. The method of claim 1, wherein the contact layer includes one of molybdenum (Mo), tungsten (W) and titanium (Ti) and tantalum (Ta).

3. The method of claim 2 further comprising depositing a second titanium nitride (TiN) film on the contact layer prior to depositing a nucleation layer on the contact layer.

4. The method of claim 3 further comprising depositing a second contact layer on the second titanium nitride (TiN) film prior to depositing a nucleation layer on the contact layer.

5. The method of claim 1, wherein the conductive barrier stack is formed using a physical vapor deposition technique.

6. The method of claim 1, wherein the step of forming the absorber precursor comprises: electroplating a film stack including at least a copper (Cu) film, an indium (In) film and a gallium (Ga) film; depositing a selenium (Se) film on the film stack using one of an electroplating process and a vapor deposition process.

7. The method of claim 1, wherein the buffer layer includes CdS and the transparent conductive oxide layer includes ZnO.

8. The method of claim 1 further comprising depositing a seed layer over the nucleation layer, wherein the seed layer is a copper (Cu) layer.

9. The method of claim 8, wherein the seed layer has a thickness in the range of 2-100 nm.

10. The method of claim 1, wherein the chromium (Cr) film has a thickness in the range of 50-100 nm.

11. The method of claim 1, wherein the titanium nitride (TiN) film has a thickness in the range of 200-400 nm.

12. The method of claim 1, wherein the contact layer has a thickness in the range of 400-1000 nm.

13. The method of claim 1, wherein the nucleation layer has a thickness in the range of 1-300 nm.

14. The method of claim 1 wherein the conductive barrier stack inhibits diffusion of both the iron (Fe) species and the Se species across the conductive barrier stack such that FeSe defects are eliminated.

\* \* \* \* \*